March 12, 1968 D. A. McCLURE 3,373,373

OUTPUT COUPLING METHOD FOR PUSH-PULL POWER AMPLIFIER

Filed Dec. 24, 1964

INVENTOR
DONALD A. McCLURE

BY Claude Funkhouser
ATTORNEY
Lawrence A. Hoffman
AGENT

United States Patent Office 3,373,373

Patented Mar. 12, 1968

3,373,373

OUTPUT COUPLING METHOD FOR PUSH-PULL POWER AMPLIFIER

Donald A. McClure, Pennsauken, N.J., assignor, by mesne assignments, to the United States of America as represented by the Secretary of the Navy Filed Dec. 24, 1964, Ser. No. 421,137
5 Claims. (Cl. 330—192)

The present invention relates to output coupling circuitry for push-pull power amplifiers, and more particularly to output coupling circuitry which provides uniform power output over an extremely wide frequency range.

The prior art has shown the existence of a need for a linear amplifier of moderate power output having flat frequency response over the range 1 to 40 megacycles. It is quite desirable that such an amplifier operate in class B to gain high efficiency, and in push-pull to minimize even harmonic distortion in the output waveform. Prior to the present invention, a typical transistor amplifier operating in class B, push-pull, with a conventional bifilar transformer having an output coupling winding, had an upper frequency limit of about 7 megacycles. The present invention is intended to extend this frequency range by a factor of about four or five.

It is an object of the present invention to provide a push-pull, class B, transistor amplifier providing uniform power output over a 1 to 40 megacycle range without tuning or switching.

It is a further object of the present invention to provide a push-pull, class B, transistor amplifier providing sufficient coupling between halves of the push-pull output to essentially eliminate the even order harmonics.

It is a further object of the present invention to provide a push-pull, class B, transistorized amplifier having proper load impedance for each amplifying device thereby realizing good efficiency and low distortion over an extended frequency range.

The present invention accomplishes the above indicated results by modifying the conventional N-filar output transformer so that each wire pair is operated in such a manner as to absorb the interwinding capacitance within the characteristic impedance of the transmission line formed by each wire pair.

The exact nature of this invention as well as other objects and advantages thereof will be readily apparent from consideration of the following specification relating to the annexed drawings in which.

Figure 1:
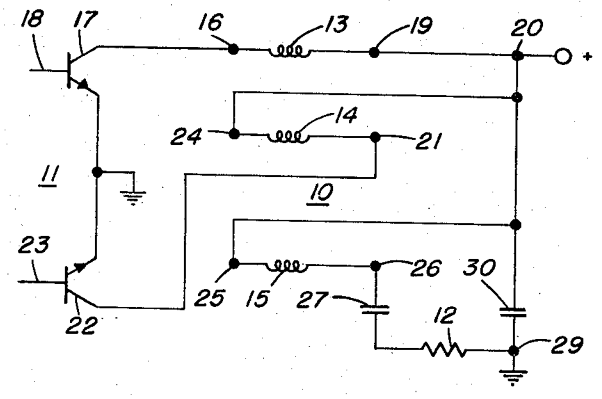
FIG. 1 is a circuit diagram showing a preferred embodiment of the present invention.

Referring now to FIG. 1, a preferred embodiment of the present invention is seen to comprise a three wire transmission line 10 driven by a push-pull, class B, transistor amplifier 11 and terminated by a load impedance 12. Transmission line 10 may comprise three equal lengths 13, 14 and 15 of insulated wire. Wire 13 is connected at terminal 16 to collector 17 of one of the transistors 18 in push-pull amplifier 11, and at terminal 19 to a suitable DC power supply 20 to provide operating current to transistor 18. Similarly, wire 14 is connected at terminal 21 to the collector 22 of the remaining transistor 23 in push-pull amplifier 11, and at terminal 24 to the DC power supply 20, to provide operating current to transistor 23. Wire 15 is connected at terminal 25 to the DC power supply 20 and at terminal 26 to load resistor 12 through capacitor 27. Load resistor 12 is connected at its other end directly to ground at point 29. Capacitors 27 and 30 are sufficiently large to provide low R.F. reactance, thereby assuring that terminal 25 of winding 15 is at AC ground.

Choice of the particular wire which will comprise transmission line 10 is dictated by the characteristics of the load impedance 12 whose value the characteristic impedance of the transmission line 10 must equal in this configuration for proper operation. Typically, the characteristic impedance existing between a pair of adjacent wires ranges from 25 to 150 ohms, depending on the thickness of the insulation relative to the wire diameter, and upon the dielectric constant of the insulation. Accordingly, for load impedance values within the above mentioned range, the present invention provides significant benefit.

The operation of the circuit of FIG. 1 may be best explained by reference to FIG. 2, which shows the AC equivalent circuit during the time of conduction of transistor 18. Since amplifier 11 is operating in push-pull, transistor 23 is not conducting during this time so that terminal 21 is open and wire 14 is connected only to ground at terminal 24.

Transistor 18 is shown as a generator working into two transmission lines in parallel, one of which (13 and 15) is terminated in its characteristic impedance, and the other (13 and 14) is open circuited at the load end. Line 14 and 15 is not driven by the generator since terminals 24 and 25 are grounded.

If we assume that the characteristics of transmission line 10 are so chosen that the load impedance 12 is equal to the characteristic impedance of any pair of wires in the three wire line, then the impedance $Z_s$ seen by the generator is:

$$Z_s=R\frac{(-j\cot Bx)}{(1-j\cot Bx)} \quad (1)$$

where B is equal to phase constant of the line and $x$ equals the electrical length of the line. From the above, it may be seen that $Z_s$ is nearly equal to R at values of $Bx$ for which the cotangent is large.

Figure 3:
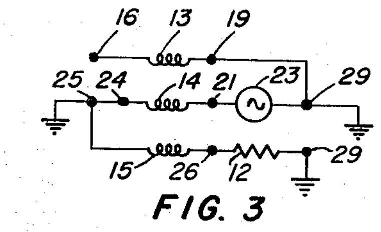
FIG. 3 shows an equivalent circuit of the network of FIG. 1 when the other of the power transistors is conducting.

Referring now to FIG. 3, the equivalent circuit for the case of transistor 18 non-conducting and transistor 23 conducting will be explained. In this case it may be seen that the series combination of the line consisting of wires 14, 15 and load impedance 12 is in parallel with the open ended line formed by wires 13 and 14. Again, assuming that the characteristic impedance of the lines is equal to the impedance of load 12, the impedance seen by the generator is:

$$Z_s=R\frac{(1-j\cot Bx)}{1+j(\tan Bx-\cot Bx)}=R\frac{(1-j\cot Bx)}{(1-j\,2\cot 2Bx)} \quad (2)$$

Figure 2:
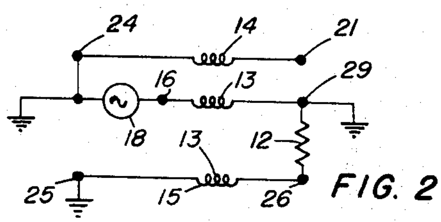
FIG. 2 shows equivalent circuit of the network of FIG. 1 when one of the power transistors is conducting.

Comparing this expression with that found for the case shown in FIG. 2, it may be seen that the impedance symmetry (i.e., approximately equal load impedance for each of transistors 18 and 23 during its conductive period) is lost as the $Bx$ term approaches 45 degrees. In practice, such a situation does not arise as long as $x$ is sufficiently less than one-eighth of the wave length of the signals on the line.

It should be recognized that in both of the cases shown in FIGS. 2 and 3, the output capacitance of the non-conducting transistor will alter the behavior of the open circuited line and change the simple impedance expressions given, but Equations 1 and 2 are good first approximations, especially if the capacitances involved are small.

Figure 4:
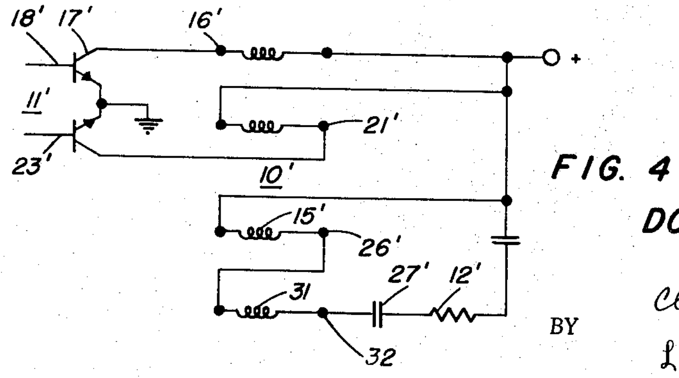
FIG. 4 shows an alternative embodiment of the present invention.

An alternative embodiment of the invention shown in FIG. 1 is shown in FIG. 4. Here, four-wire transmission line 10′ is shown driven by transistor push-pull amplifier 11′ and feeding output load 12′. Transmission line 10′ differs from transmission line 10 in FIG. 1 only in the addition of a fourth winding 31 connected at termnials 26′ to windings 15′. Load 12′ is connected to winding 31 at terminal 32 by a DC blocking capacitor 27′ as shown in FIG. 1.

The operation of FIG. 4 is essentially the same as that of the circuit of FIG. 1, except that wires 15′ and 31 form a built-in 4:1 impedance transformer. Therefore, the nominal impedance seen by the transistors 18′ and 23′ is equal to one fourth the impedance of load 12′.

Figure 5:
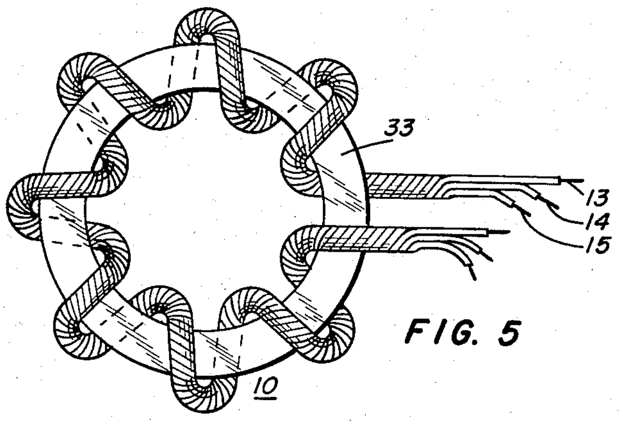
FIG. 5 shows a suitable construction of the coupling network itself.

The exact nature of the three and four wire transformers of the present invention may be clearly seen in FIG. 5. For coupling network 10, three equal lengths 13, 14, and 15 of No. 26 Formvar covered wire are twisted together and wound about a ferrite toroid 34. In the present invention, about 20 inches of trifilar (or in the case of transformer 10′ quadrifilar) lines were wound on the toroid.

Obviously, many modifications and variations of the present invention are possible in the light of the above teaching. It is therefore to be understood that within the scope of the appended claims, the invention may be practiced otherwise than as specifically described.

What is claimed is:

1. A push-pull coupling network for transmitting power the even order harmonics of which are suppressed comprising:

a push-pull amplifier having two outputs and operative to generate power through either output during alternative halves of a power cycle;

a transmission line having a plurality of wires in close parallel relationship, said wires having two terminals, the first wire of which has its first terminal connected to one output of said push-pull power amplifier and the second wire of which has its first terminal connected to the second output of said push-pull power amplifier;

a load impedance having two terminals, the first terminal of which is connected to the first terminal of the third wire of said transmission line; and a terminal of zero AC potential to which the second terminal of the three wires of said transmission line and the load impedance are connected, whereby a signal is transmitted by either of said first or second wires to said load during one-half of the power cycle which is of opposite polarity to the signal transmitted by the other of said first or second wires during the alternate half of the power cycle and whereby said load impedance serves as the characteristic impedance of the transmitting line.

2. The device as described in claim 1 further containing a toroidal core of magnetic material around which the wires of said transmission line are wound to provide a multifilar transformer arrangement.

3. The device as described in claim 2 wherein said transmission line further contains a fourth wire connected between the first terminal of the load impedance and the first terminal of the third wire of said transmission line.

4. The device as described in claim 1 wherein said transmission line further contains a fourth wire connected between said first terminal of the load impedance and said first terminal of the third wire of said transmission line.

5. The device as described in claim 4 further containing a toroidal core of magnetic material around which the wires of said transmission line are wound to provide a multifilar transformer ararngement.

References Cited

UNITED STATES PATENTS

| | | | |
|---|---|---|---|
| 2,222,406 | 11/1940 | Crossley | 343—860 X |
| 3,168,715 | 2/1965 | Woodworth | 333—26 X |
| 3,244,998 | 4/1966 | Broadhead | 330—197 X |

OTHER REFERENCES

Morita, "High Frequency Feeders Consisting of Three Parallel Conductors," ETJ (Electro-Technical Journal) vol. 3, No. 7, July 1939, pp. 164–166.

Proceedings of the Ire "Some Broad-Band Transformers" by C. L. Ruthroff, August 1959, pp. 1337–1342.

"Semiconductor Fundamentals" Seidman and Marshall, John Wiley and Sons, Inc., New York, 1963, pp. 168–169 relied upon (Copy available in Group 250 Library).

HERMAN KARL SAALBACH, *Primary Examiner.*

ELI LIEBERMAN, *Examiner.*

M. NUSSBAUM, *Assistant Examiner.*